(12) United States Patent
Nogami

(10) Patent No.: US 6,399,505 B2
(45) Date of Patent: *Jun. 4, 2002

(54) METHOD AND SYSTEM FOR COPPER INTERCONNECT FORMATION

(75) Inventor: Takeshi Nogami, Sunnyvale, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/954,175

(22) Filed: Oct. 20, 1997

(51) Int. Cl.⁷ .............................................. H01L 21/302
(52) U.S. Cl. .................. 438/706; 438/720; 438/724; 438/734; 438/735; 438/737; 438/738; 438/739; 438/740; 438/742
(58) Field of Search ................................ 438/706, 734, 438/735, 737, 738, 739, 690, 720, 724, 740, 742

(56) References Cited

U.S. PATENT DOCUMENTS

| | | | | |
|---|---|---|---|---|
| 4,931,410 A | * | 6/1990 | Tokunaga et al. | 437/189 |
| 5,227,337 A | * | 7/1993 | Kadomura | 437/192 |
| 5,407,763 A | * | 4/1995 | Pai | 430/5 |
| 5,420,071 A | * | 5/1995 | Burke | 437/192 |
| 5,824,599 A | * | 10/1998 | Schacham-Diamand et al. | 438/678 |
| 5,854,134 A | * | 12/1998 | Lan et al. | 438/695 |

* cited by examiner

Primary Examiner—Felisa Hiteshew
Assistant Examiner—Vanessa Pérez-Ramos
(74) Attorney, Agent, or Firm—Sawyer Law Group LLP

(57) ABSTRACT

A system and method for reducing contamination in a semiconductor device formed on a substrate is disclosed. The method and system include providing a barrier metal layer on the substrate. A first portion of the barrier metal layer is thinner than a second portion of the barrier metal layer. The method and system further include removing the first portion of the barrier metal layer.

9 Claims, 1 Drawing Sheet

METHOD AND SYSTEM FOR COPPER INTERCONNECT FORMATION

FIELD OF THE INVENTION

The present invention relates to semiconductor processing and more particularly to a method and system for reducing the contamination due to copper interconnect formation.

BACKGROUND OF THE INVENTION

Copper interconnects can be formed during semiconductor processing. In forming copper interconnects, a trench is first provided in the silicon substrate. Next, a barrier metal is typically deposited to prevent the copper to be used in an interconnect or via from migrating. Then, copper plating is performed, filling the trench and providing the interconnect.

Typically, the barrier metals that are used also work as a seed layer for copper. Such barrier metals are used to allow the growth of the copper on the barrier metal in the trench or the via. If barrier metals which cannot act as a seed layer are used, the copper will not properly grow in the trench or via unless a separate seed layer is provided.

Although the above process forms copper interconnects, the barrier metal is deposited at the edge and rear of the silicon substrate as well as in the trenches or vias. Because the barrier metal acts as a seed layer for copper, a copper film also develops at the edge and rear of the substrate during copper plating. Because this copper film is thin, it does not adhere well to the silicon substrate and peels during processing. Pieces of the peeled copper film may then contaminate the circuitry formed towards the center of the silicon substrate.

Accordingly, what is needed is a system and method for providing copper interconnects and vias without introducing copper contamination due to films formed at the edge of the substrate. The present invention addresses such a need.

SUMMARY OF THE INVENTION

The present invention provides a method and system for reducing contamination in a semiconductor device formed on a substrate. A first portion of the barrier metal layer is thinner than a second portion of the barrier metal layer. The method and system further comprise removing the first portion of the barrier metal layer.

According to the system and method disclosed herein, the present invention reduces copper contamination, thereby increasing overall system performance.

DETAILED DESCRIPTION OF THE INVENTION

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
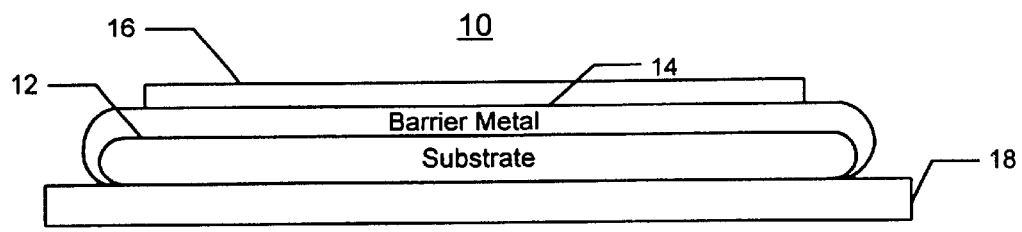
FIG. 1 is a block diagram of a conventional system for providing copper interconnects.

FIG. 1 is a block diagram of a conventional substrate during formation of copper interconnects and vias. The substrate 12 is typically silicon. The substrate is placed on an apparatus including a base 18. After formation of trenches or via holes, not shown, a layer of barrier metal 14 is deposited onto the substrate 12. The barrier metal layer 14 is used to block the migration of copper outside of the interconnects and vias. Typically, the barrier metal layer 14 is formed through chemical vapor deposition ("CVD"). In some instances a seed layer 16 is also grown on the barrier metal layer 14. After the seed layer 16 is provided, a copper layer, not shown, is deposited. Typically, the copper layer is formed by electroplating copper.

Although the system shown in FIG. 1 allows formation of copper interconnects and vias, those with ordinary skill in the art will realize that copper deposited during formation of the interconnects and vias will contaminate the structures formed on the substrate 12. The barrier metal layer 14 covers not only the open portion, but also covers the edge and a portion of the back of the substrate 12. Thus, a thin layer of the barrier metal chosen for the barrier metal layer 14 is present at the edge and rear of the substrate 12. Typically, the barrier metal layer 14 is approximately 300 Angstroms near the center of the substrate 12 and approximately 30 Angstroms at the edge and rear of the substrate 12.

The barrier metal layer 14 can typically act as a seed layer for copper. For example, tungsten-nitride ($WN_x$ where x is an integer) or titanium-nitride (TiN) is typically used to form the barrier metal layer 14. This feature of the barrier metal layer 14 is important in aiding the growth of the copper to form the interconnects and vias. Because the barrier metal layer 14 is a seed layer, the copper plating causes a thin layer of copper, not shown, to grow on the thin portion of the barrier metal layer 14, at the edge and back of the substrate 12. The thin copper layer does not adhere well to the substrate 12. As a result, the thin copper layer peels off of the edge and back of the substrate 12, contaminating the circuits formed on the substrate 12.

The present invention provides for a method and system for removing a portion of the barrier metal layer. The present invention will be described in terms of a particular process for etching a portion of the barrier metal layer. However, one of ordinary skill in the art will readily recognize that this method and system will operate effectively for other types of methods for removing the portion of the barrier metal layer.

Figure 2A:
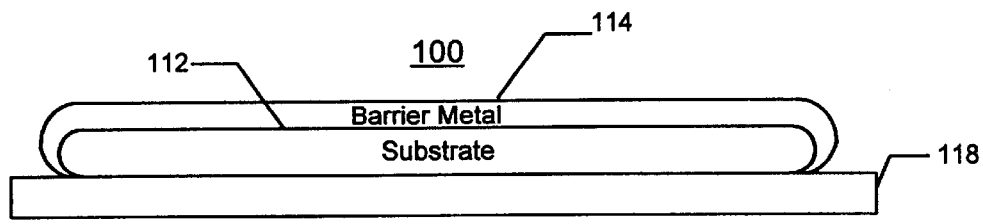
FIG. 2A is a block diagram of a system for providing copper interconnects in accordance with the method and system just after deposition of a barrier metal layer.
Figure 2B:
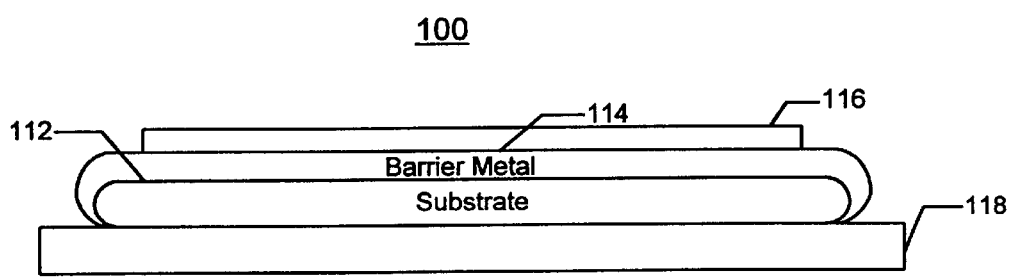
FIG. 2B is a block diagram of a system for providing copper interconnects in accordance with the method and system during etching.

To more particularly illustrate the method and system in accordance with the present invention, refer now to FIG. 2A depicting a block diagram of one embodiment of such a system 100 just after deposition of a barrier metal. The system 100 of the present invention includes a base 118. The substrate 112 is placed on the base 118. Trenches or vias are then formed in the substrate 112. Next, a barrier metal layer 114 is deposited to prevent diffusion of any copper deposited later. In a preferred embodiment, the barrier metal layer 114 is deposited using CVD. Typically, the barrier metal layer 114 is much thicker near the center of the substrate 112 than near the edge. In a preferred embodiment, the barrier metal layer 114 is approximately three hundred Angstroms near the center and approximately thirty Angstroms near the edge of the substrate 112. Generally, the barrier metal layer 114 is on the order of ten times thicker at the center of the substrate 112 than at the edge and back of the substrate 112. After deposition of the barrier metal layer 114, a seed layer 116 is deposited. The seed layer 116 improves adhesion of the copper layer, not shown, which is to be deposited later. FIG. 2B depicts the system 100 after deposition of the seed layer 116.

In accordance with the method and system, the barrier metal layer 114 is etched after deposition of the seed layer 116. This etch removes the thin portions of the barrier metal layer 114 at the edge and back of the substrate. In a preferred embodiment, if the barrier metal layer 114 is composed of tungsten nitride, the etching gas is preferably $NF_3$. In another embodiment, if the barrier metal layer 114 is composed of titanium nitride, the etching gas used may be chlorine.

Etching the barrier metal layer 114 removes the portion of the barrier metal layer 114 at the edge and back of the substrate 112. Because of the presence of the seed layer 116, the metal in the central portion of the substrate 112 is not significantly etched. This removes the thinner portion of the barrier metal layer 114. Typically, the thinner portion of the barrier metal layer 114 is at the edge and back of the substrate 112. Thus, the etch removes the portion of the barrier metal layer 114 to which copper would otherwise adhere. Because of the seed layer 116, the thinner portions of the barrier metal layer 114 have been removed while the thicker portion of the barrier metal layer 114 lying beneath the seed layer 116 remains substantially unchanged. Thus, in accordance with the method and system, the thin portion of the barrier metal layer 114 will be removed.

Figure 2C:
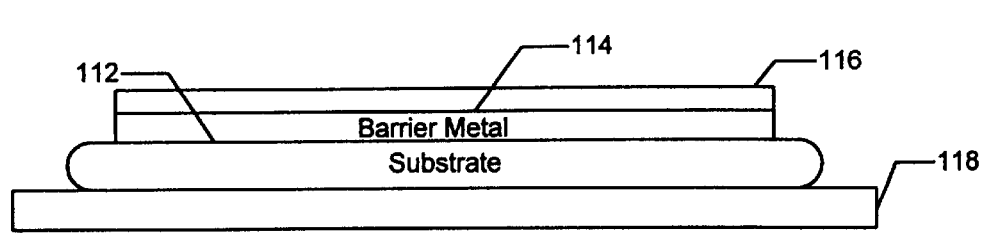
FIG. 2C is a block diagram of a system for providing copper interconnects in accordance with the method and system after etching.

Refer now to FIG. 2C, depicting one embodiment of the system 100 after etching of the barrier metal layer 114. The thin portions of the barrier metal layer 114 have been removed, leaving only the thicker central portion lying beneath the seed layer 116. Because the portion of the barrier metal layer at the edge and back of the substrate 114 was etched while the portion of the barrier metal layer at the center of the substrate 114 was protected by the seed layer 116, the portion of the barrier metal layer 114 remaining can still prevent diffusion of the copper, not shown, that will be plated later. In addition, because the portion of the barrier metal layer 114 at the edge and back of the substrate 112 has been removed, there is no seed layer for copper to adhere to at these portions of the substrate. As a result, deposition of copper at the edges and back of the substrate is greatly reduced. The contamination due to copper peeling off of the substrate 112 is thereby reduced.

A method and system has been disclosed for providing copper interconnects with reduced contamination due to copper deposited at the edge or rear of the substrate.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for reducing contamination in a semiconductor device formed on a substrate including a center, an edge, a front, and a back, the method comprising the steps of:

providing a barrier metal layer on the substrate, a first portion of the barrier metal layer being located near the edge and back of the substrate, a second portion of the barrier metal layer being near the center of the substrate, the first portion of the barrier metal layer being thinner than the second portion of the barrier metal layer, the barrier metal layer for providing a barrier between a first conductor used in an interconnect structure and the substrate; removing the first portion of the barrier metal layer; and depositing the first conductor used in forming the interconnect structure on the barrier metal layer after removal of the first portion of the barrier metal layer, wherein the barrier metal layer and the first conductor form a portion of the interconnect structure within a single level of the semiconductor device.

2. The method of claim 1 further comprising the steps of: providing a seed layer located near the center of the substrate.

3. The method of claim 2 wherein the step of removing the portion of the barrier metal layer near the substrate edge and substrate back further comprises the step of:

etching the first portion of the barrier metal layer using an etching gas.

4. The method of claim 3 wherein the barrier metal layer further comprises tungsten nitride; and the etching gas further comprises $NF_3$.

5. The method of claim 3 wherein the barrier metal layer further comprises titanium nitride; and the etching gas further comprises chlorine.

6. The method of claim 1 further comprising the step of: providing at least one trench for forming the at least one interconnect prior to providing the barrier metal layer.

7. The method of claim 1 wherein the first conductor is copper.

8. The method of claim 1 wherein the front is a first face and the back is a second face, the first face and the second face being two opposing faces, the semiconductor device and the at least one interconnect being formed on the front of the substrate.

9. A method for reducing contamination in a semiconductor device formed on a substrate including a center, an edge, a front, and a back, the method comprising the steps of:

providing a barrier metal layer on the substrate, a first portion of the barrier metal layer being located at the edge and back of the substrate, a second portion of the barrier metal layer being near the center of the substrate, the first portion of the barrier metal layer being thinner than the second portion of the barrier metal layer, the barrier metal layer for providing a barrier between a first conductor used in an interconnect structure and the substrate;

removing the first portion of the barrier metal layer; and depositing the first conductor used in forming the interconnect structure on the barrier metal layer after removal of the first portion of the barrier metal layer, wherein the barrier metal layer and the first conductor form a portion of the interconnect structure within a single level of the semiconductor device, and wherein the front and back are two opposing faces, the semiconductor device and the interconnect structure being formed near the center and on the front of the substrate.

* * * * *